(12) United States Patent
Tsuura

(10) Patent No.: US 7,053,495 B2
(45) Date of Patent: May 30, 2006

(54) SEMICONDUCTOR INTEGRATED CIRCUIT DEVICE AND METHOD FOR FABRICATING THE SAME

(75) Inventor: Katsuhiko Tsuura, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/243,915

(22) Filed: Sep. 16, 2002

(65) Prior Publication Data

US 2003/0052440 A1    Mar. 20, 2003

(30) Foreign Application Priority Data

Sep. 17, 2001  (JP) ............................... 2001-281431

(51) Int. Cl.
*H01L 23/544* (2006.01)

(52) U.S. Cl. .................. 257/797; 257/529; 257/48; 257/758; 257/665; 257/642; 257/530; 257/209; 257/643; 257/759; 438/401; 438/462; 438/975

(58) Field of Classification Search .................. 257/98, 257/642, 48, 758, 752, 620, 666, 700, 665, 257/530, 209, 643, 759, 529; 438/401, 462, 438/975
See application file for complete search history.

(56) References Cited

U.S. PATENT DOCUMENTS 6,344,698 B1 * 2/2002 Barr et al. .................. 257/797
6,392,300 B1 * 5/2002 Koike .......................... 257/758
6,457,169 B1 * 9/2002 Ross ............................ 716/21
6,586,282 B1 * 7/2003 Takasu ....................... 438/132
6,784,516 B1 * 8/2004 Daubenspeck et al. ..... 257/529

FOREIGN PATENT DOCUMENTS

| JP | 05-109873 | 4/1993 |
|---|---|---|
| JP | 07-221166 | 8/1995 |
| JP | 08274017 | 10/1996 |
| JP | 11121623 | 4/1999 |
| JP | 2001-035924 | 2/2001 |
| JP | 2001144197 | 5/2001 |
| JP | 2002184777 | 6/2002 |

* cited by examiner

*Primary Examiner*—Eddie C. Lee
*Assistant Examiner*—Junghwa Im
(74) *Attorney, Agent, or Firm*—McDermott Will & Emery LLP

(57) ABSTRACT

A semiconductor integrated circuit device includes: Si substrate; multilevel interconnect layer formed on the Si substrate; and dielectric layer formed on the multilevel interconnect layer. External-component-connecting wire, ordinary wire, fuse wire, stepper alignment mark, and target mark are formed out of an identical copper film in the uppermost metal layer. External-component-connecting pad electrode, testing-processing alignment mark, and stepper alignment mark are formed out of an identical aluminum alloy film on the dielectric film. In laser-machining the fuse wire, alignment using the target mark formed in the metal layer including the fuse wire reduces alignment errors caused from the machining.

9 Claims, 8 Drawing Sheets

SEMICONDUCTOR INTEGRATED CIRCUIT DEVICE AND METHOD FOR FABRICATING THE SAME

BACKGROUND OF THE INVENTION

The present invention relates to semiconductor integrated circuit devices and methods for fabricating the same. More particularly, the present invention relates to measurements for improving alignment accuracy in processing fuses that are used for circuits such as circuits for redundancy replacement or circuits for function adjustment.

Recently, with progress in microfabrication technology of semiconductor processing, system-on-a-chips including semiconductor memory devices (hereinafter, referred to as "memory circuits") such as large-capacity dynamic random access memories (hereinafter, referred to as "DRAMs") or large-capacity static random access memories (hereinafter, referred to as "SRAMs") have been developed as semiconductor integrated circuit devices. To achieve further integration in the semiconductor integrated circuit devices, multilevel interconnection technology has been adopted into interconnection that connects circuit elements.

On the other hand, as the memory circuit increases in capacity due to the progress in the microfabrication technology, a larger number of defective bits causing malfunction of the memory circuit are created by, for example, fine dusts produced during a fabrication process. The presence of the defective bits makes the overall semiconductor integrated circuit device inoperable, thus decreasing the production yield.

One solution for eliminating the decrease in production yield caused by the defective bits is a technique of redundancy replacement. In this technique of redundancy replacement, the memory circuit and a spare memory bit are previously formed within a chip at the same time. Then, when a defective memory bit occurs, the defective memory bit is replaced with the spare memory bit so that all the bits corresponding to the memory capacity required for the memory circuit are constituted by conforming bits. That is to say, the technique of redundancy replacement is a technique for repairing defective bits. In this case, connections of an access signal between the defective memory bit and the spare memory bit are switched using a laser machining technique, i.e., irradiating a fuse portion of the circuit for redundancy replacement on the chip with a laser beam so that the fuse portion is burnt out and blown.

Conventionally, in a semiconductor integrated circuit device with a multilevel interconnection structure, a bit line, made of a polycide film as a stack of polysilicon and tungsten silicide, and a fuse wire are formed at the same time. If the multilevel interconnection has three or more levels, an aluminum alloy interconnect made of an AlCu film (i.e., an aluminum and copper alloy film) containing aluminum as a main component is used, so that the fuse wire is subjected to laser machining concurrently with an aluminum alloy interconnect formed in the uppermost layer.

On the other hand, as the interconnection has been downsized, a copper film, which can be downsized and has a low resistivity, has been used as an interconnect material, instead of the aluminum alloy film, for the purposes of suppressing the delay in circuit operation due to the rise in interconnect resistance and suppressing increase in heat generated by current. However, if a pad that is connected to a lead of a package via a metal fine wire is made of the copper film, the surface of the copper film is likely to be oxidized during assembly of a product. Accordingly, for ordinary wire bonding, it is impossible to connect the copper film to the metal fine wire because an oxide film has been formed on the surface of the copper. Thus, an aluminum alloy pad electrode used as an external-component-connecting pad electrode is formed only on a lead electrode part of the copper interconnect.

In the semiconductor integrated circuit device including the aluminum alloy pad electrode formed on the lead electrode of the copper interconnect, an alignment mark that is used during a probe test process for evaluating electric properties or an assembly process such as chip dicing or wire bonding is made of an aluminum alloy film forming the aluminum alloy pad electrode, as in a known semiconductor integrated circuit device with a multilevel interconnection structure including an aluminum alloy interconnect. Thus, the alignment mark and the aluminum alloy pad electrode are formed at the same time.

Hereinafter, alignment marks for use in a known semiconductor integrated circuit device including a copper interconnect and an aluminum alloy pad electrode will be described.

FIG. 8 is a cross-sectional view showing a structure of an interconnect layer in a known system-on-a-chip including a memory such as a DRAM or SRAM (a semiconductor integrated circuit device) with a function of redundancy replacement.

As shown in FIG. 8, the known semiconductor integrated circuit device includes: Si substrate 101; multilevel interconnect layer 102 formed on the Si substrate 101 by a process such as a dual or single damascene process; and dielectric film (an uppermost interlevel dielectric film) 103 formed on the multilevel interconnect layer 102. The uppermost metal layer 102a of the multilevel interconnect layer 102 includes: external-component-connecting wire 111; ordinary wire 112; fuse wire 113; and stepper alignment mark 114. The dielectric film 103 has an opening over the external-component-connecting wire 111. An external-component-connecting pad electrode 121 is formed on part of the dielectric film 103 to extend over the external-component-connecting wire 111 via the side face of the opening. An inorganic passivation film 104 made of, for example, a silicon nitride film and an organic buffer coating film 105 are deposited in this order over the dielectric film 103.

On the dielectric film 103, a testing-processing alignment mark 122 for use in alignment during, for example, a probe test, wire bonding or a process on the fuse wire and a stepper alignment mark 123 for use in alignment during formation of an opening in the inorganic passivation film 104 are provided. These alignment marks 122 and 123 and the external-component-connecting pad electrode 121 are formed out of an aluminum alloy film. The organic buffer coating film 105 has openings over the fuse wire 113, the testing-processing alignment mark 122, and the external-component-connecting pad electrode 121, respectively.

The stepper alignment mark 114 under the dielectric film 103 is formed, concurrently with the formation of the external-component-connecting wire 111, the ordinary wire 112 and the fuse wire 113, out of a copper film by a damascene process.

The testing-processing alignment mark 122 is generally formed in the vicinity of a corner of a chip. The passivation film 104 made of a silicon nitride film is not necessarily required so long as the reliability is ensured.

In the known semiconductor integrated circuit device, the testing-processing alignment mark 122 is an alignment mark for use in alignment during cutting or burning out of the fuse wire 113 with a laser, for use in alignment during a test performed by making the external-component-connecting pad electrode 121 in contact with a probe, for use in alignment during wire bonding, and also for use in alignment during dicing.

However, laser machining on the fuse wire of the circuit for redundancy replacement, for example, causes a problem of alignment errors leading to positional shift in, for example, the processed part. This is because the following reasons. The testing-processing alignment mark 122 is formed out of the aluminum alloy film constituting the external-component-connecting pad electrode 121, while the fuse wire 113 is formed out of the copper film constituting the external-component-connecting wire 111. Accordingly, all the errors in positioning the external-component-connecting pad electrode 121 relative to the external-component-connecting wire 111 are added to the alignment errors caused through the laser machining, and the errors are added to alignment errors caused by the laser trimmer.

SUMMARY OF THE INVENTION

It is therefore an object of the present invention to provide a semiconductor integrated circuit device including a pad electrode on a lead electrode of a copper interconnect in which highly accurate alignment is achieved in laser-machining a fuse wire. It is another object of the present invention to provide a method for fabricating the device.

Specifically, an inventive semiconductor integrated circuit device includes: a substrate; a plurality of metal layers stacked over the substrate; a dielectric film formed on the uppermost metal layer of the plurality of metal layers; an external-component-connecting wire included in one of the plurality of metal layers and made of a first metal film; an external-component-connecting pad electrode formed on the dielectric film, made of a second metal film, and connected to the external-component-connecting wire; a fuse wire included in said one or another of the plurality of metal layers and made of the first metal film; and a target mark that is included in the metal layer including the fuse wire and is made of the first metal film.

In this structure, the target mask formed on the metal layer including the fuse wire is used for alignment for laser machining. Thus, alignment accuracy between the fuse wire and a site to be irradiated during the laser machining improves.

The inventive device may include a pad-electrode alignment mark for use in alignment relative to the pad electrode. The pad-electrode alignment mark is formed on the dielectric film and made of the second metal film. Then, alignment for a probe test or a dicing process can be performed using the alignment mark, thereby reducing alignment errors with respect to the external-component-connecting pad electrode or a scribing line.

The inventive device may include a stepper alignment mark formed on the dielectric film and made of the second metal film.

The inventive device may include a stepper alignment mark that is included in the metal layer including the fuse wire and is made of the first metal film.

It is preferable that the target mark and the pad-electrode alignment mark are substantially L-shaped in plan view. Then, a region where the marks for alignment are to be formed can be reduced.

It is preferable that the substantially L-shaped target mark and pad-electrode alignment mark overlap at their elbows in plan view; and the target mark and the pad-electrode alignment mark are disposed in point-symmetry with each other centered on the elbows. Then, a region where the marks for alignment are to be formed can be further reduced.

It is preferable that the target mark includes a first Y-direction mark in the form of a stripe extending in a Y direction and a first X-direction mark in the form of a stripe extending in an X direction; the pad-electrode alignment mark includes a second Y-direction mark in the form of a stripe extending in the Y direction and a second X-direction mark in the form of a stripe extending in the X direction; and the substantially L-shaped target mark and pad-electrode alignment mark overlap at their elbows in plan view, and the elbows include neither the first metal film nor the second metal film. This enables recognition of a chip with a more distinctive image using the pad-electrode alignment mark, thus further easing the alignment.

It is preferable that the target mark and the pad-electrode alignment mark are disposed so as not to overlap in plan view. Then, errors in recognizing an alignment mark can be effectively prevented during alignment.

The external-component-connecting wire is preferably included in the uppermost metal layer.

The inventive device may include a buffer coating film formed over the dielectric film and having an opening over the target mark, the fuse wire and the pad electrode.

The inventive device may include an inorganic passivation film covering respective parts of the dielectric film and the pad electrode. Then, foreign matter or moisture is effectively prevented from entering the semiconductor integrated circuit device.

The first metal film may be made of a copper film; and the second metal film may be made of an aluminum alloy film containing aluminum as a main component.

An inventive method for fabricating a semiconductor integrated circuit device includes the steps of: a) forming, over a substrate, a plurality of metal layers, an external-component-connecting wire included in the uppermost metal layer of the plurality of metal layers and made of a first metal film, a dielectric film formed on the uppermost metal layer, an external-component-connecting pad electrode formed on the dielectric film, made of a second metal film and connected to the external-component-connecting wire, a fuse wire included in one of the plurality of metal layers and made of the first metal film, and a target mark included in the metal layer including the fuse wire and made of the first metal film; and b) performing alignment for laser machining of blowing the fuse wire, using the target mark.

According to this method, alignment between a site to be irradiated with a laser beam and the fuse wire can be performed with high accuracy during laser machining. Thus, it is possible to suppress the occurrence of defects caused by errors in laser-machining the fuse wire, which cannot be restored.

The inventive method may include the steps of: forming, on the dielectric film, a pad-electrode alignment mark for use in alignment relative to the pad electrode, the pad-electrode alignment mark being made of the second metal film and connected to the external-component-connecting wire; and c) performing alignment for at least one of a probe test and dicing for a semiconductor integrated circuit chip fabrication, using the pad-electrode alignment mark.

In the step a), a copper film may be used as the first metal film and an aluminum alloy film containing aluminum as a main component may be used as the second metal film.

DESCRIPTION OF THE PREFERRED EMBODIMENTS (Embodiment 1)

Figure 1:
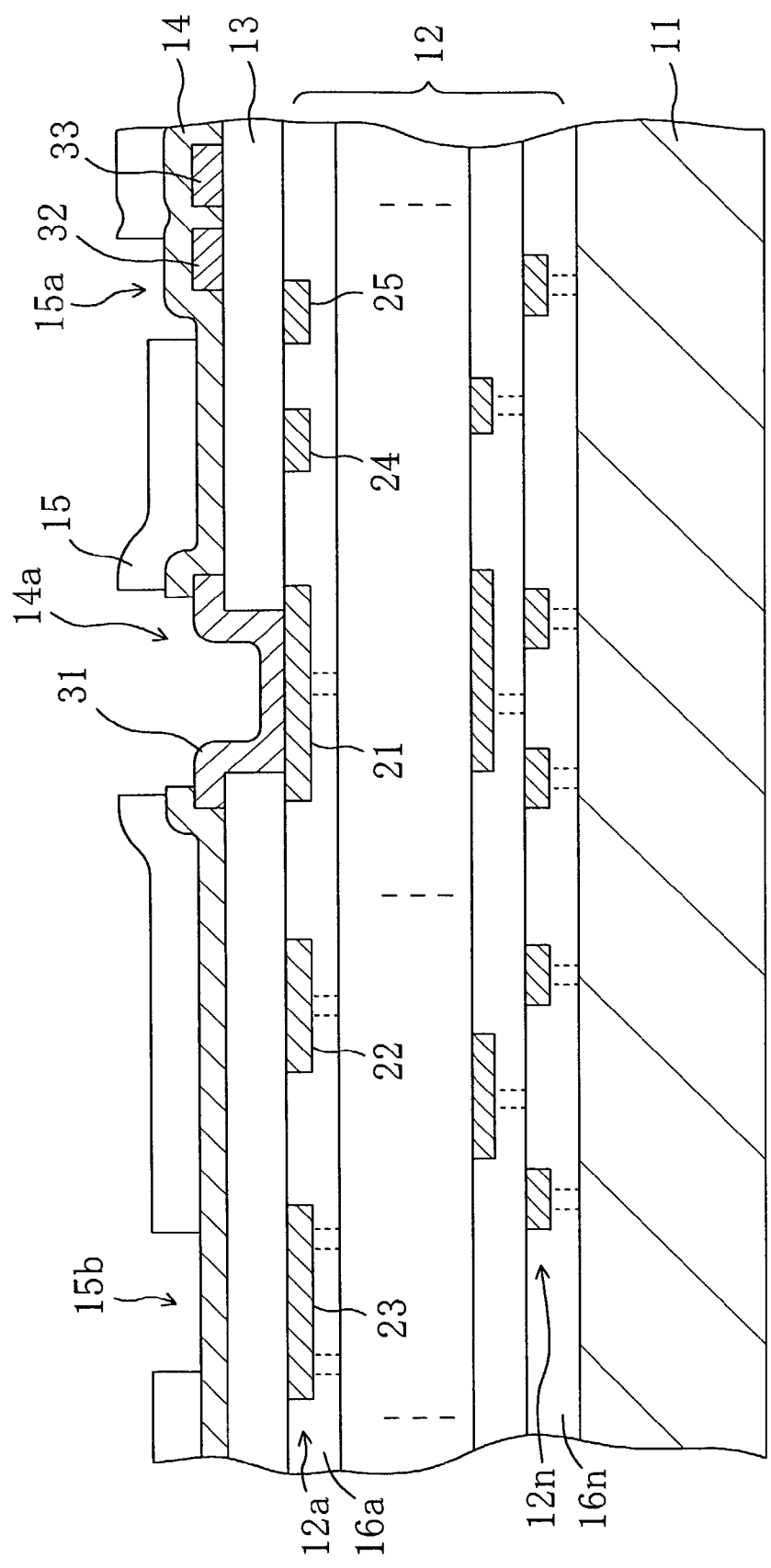
FIG. 1 is a cross-sectional view showing a structure of an interconnect layer in a system-on-a-chip including a DRAM or SRAM (a semiconductor integrated circuit device) with a function of redundancy replacement according to a first embodiment of the present invention.

FIG. 1 is a cross-sectional view showing a structure of an interconnect layer in a system-on-a-chip including a DRAM or SRAM (a semiconductor integrated circuit device) and having a function of redundancy replacement according to a first embodiment of the present invention.

As shown in FIG. 1, the semiconductor integrated circuit device of the first embodiment includes: Si substrate 11 including a transistor, a memory and a copper interconnect for connecting these devices (not shown); multilevel interconnect layer 12 formed on the Si substrate 11; and dielectric film (uppermost interlevel dielectric film) 13 formed on the multilevel interconnect layer 12. The multilevel interconnect layer 12 is made up of n (e.g., six) metal layers 12a to 12n buried in interlevel dielectric films 16a to 16n, respectively, by a dual damascene process. The uppermost metal layer 12a of the multilevel interconnect layer 12 includes: external-component-connecting wire 21; ordinary wire 22; fuse wire 23; stepper alignment mark 24; and target mark 25. The dielectric film 13 has an opening over the external-component-connecting wire 21. An external-component-connecting pad electrode 31 is provided on the dielectric film 13 to extend over the external-component-connecting wire 21 via the side face of the opening. An inorganic passivation film 14, which is made of a silicon nitride film, for example, and an organic buffer coating film 15 are deposited in this order over the dielectric film 13.

A testing-processing alignment mark 32 for use in alignment during, for example, probe test, wire bonding or dicing and a stepper alignment mark 33 for use in alignment during formation of an opening in the inorganic passivation film 14 are provided on the dielectric film 13. These alignment marks 32 and 33 and the external-component-connecting pad electrode 31 are formed out of an aluminum alloy film. The organic buffer coating film 15 has openings in a portion over the fuse wire 23 (an opening 15b), in a portion over the target mark 25 and the testing-processing alignment mark 32 (an opening 15a), and in a portion over the external-component-connecting pad electrode 31 (an opening 14a).

In this embodiment, the target mark 25 and the stepper alignment mark 24 under the dielectric film 13 are formed, concurrently with the formation of the external-component-connecting wire 21, ordinary wire 22 and fuse wire 23, out of a copper film by a dual damascene process. Each of the target mark 25 and the alignment mark 24 may be a trench interconnect without a via, if the via is not required.

These marks for use in alignment are generally formed in the vicinity of a corner of a chip. The passivation film 14 made of a silicon nitride film (a plasma nitride film) is not necessarily required so long as the reliability is ensured.

Figure 2A:
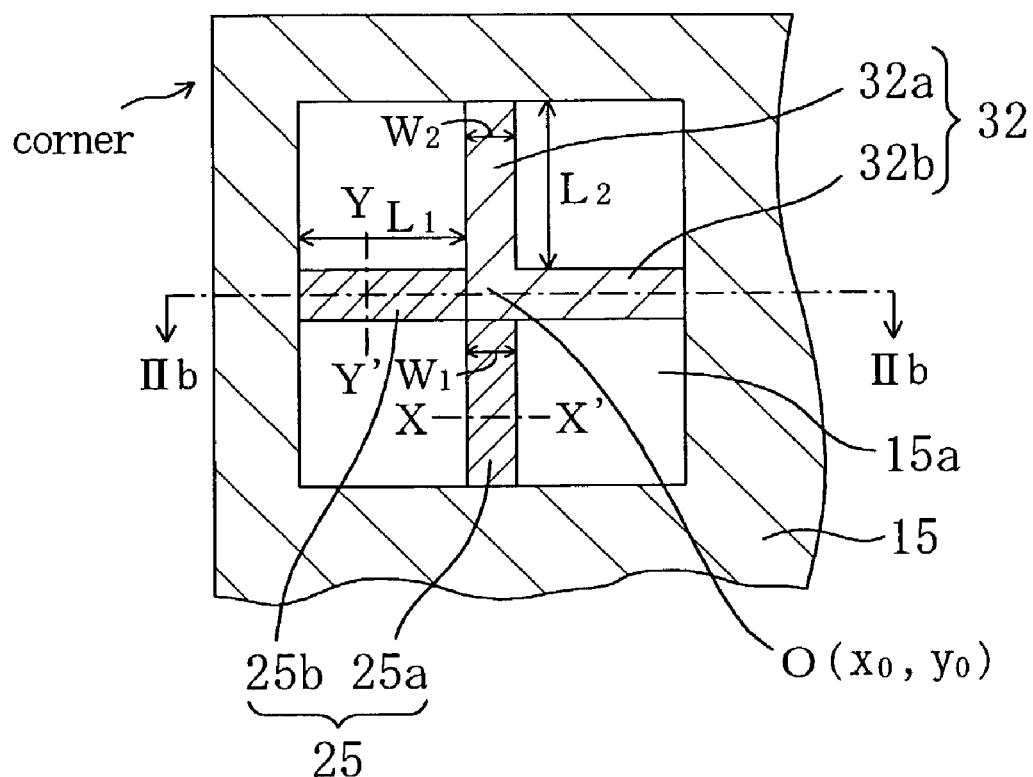
FIGS. 2A and 2B are respectively a plan view and a cross-sectional view taken along the line IIb—IIb, showing a structure near the alignment marks shown in FIG. 1.
Figure 2B:
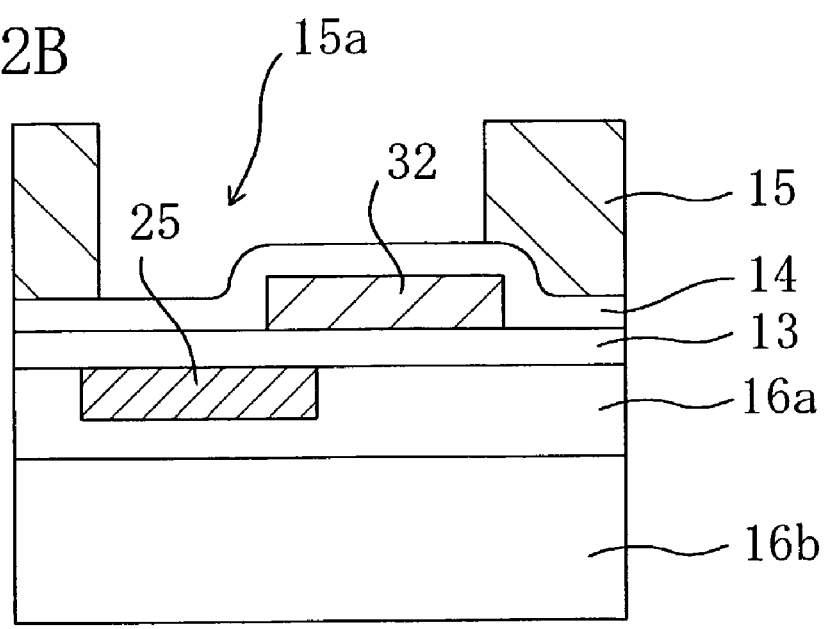

FIGS. 2A and 2B are respectively a plan view and a cross-sectional view taken along the line IIb—IIb, showing a structure near the alignment marks shown in FIG. 1. As shown in FIGS. 2A and 2B, the target mark 25 is formed, concurrently with the formation of the ordinary wire 22, fuse wire 23 of a circuit for redundancy replacement for repairing a defective memory bit, and stepper alignment mark 24 in the uppermost layer of the multilevel interconnect layer (see FIG. 1), by filling trenches formed in the interlevel dielectric film 16a with a copper film. The target mark 25 is substantially L-shaped in plan view. The testing-processing alignment mark 32 is formed, concurrently with the formation of the external-component-connecting pad electrode 31 and the stepper alignment mark 33 (see FIG. 1), by patterning an aluminum alloy film containing aluminum as a main component (e.g., an AlCu film containing several percent of copper). The testing-processing alignment mark 32 is substantially L-shaped in plan view. The organic buffer coating film 15 has an opening 15a over the target mark 25 and the testing-processing alignment mark 32.

The target mark 25 is substantially L-shaped in plan view, having a first Y-direction mark 25a extending in the Y direction and a first X-direction mark 25b extending in the X direction. Each of the first Y- and X-direction marks 25a and 25b has a width W1 of 10 μm and a length L1 of 45 μm. It should be noted that the width W1 and the length L1 of the target mark 25 do not necessarily take these values.

The testing-processing alignment mark 32 is substantially L-shaped in plan view, having a second Y-direction mark 32a extending in the Y direction and a second X-direction mark 32b extending in the X direction. Each of the second Y- and X-direction marks 32a and 32b has a width W2 of 10 μm and a length L2 of 45 μm. The testing-processing alignment mark 32 preferably has a distinctive shape and exhibits a high contrast to the substrate for recognizing the chip. It should be noted that the width W2 and the length L2 of the testing-processing alignment mark 32 do not necessarily take these values. The width W2 and the length L2 need not be the same as the width W1 and the length L1 of the target mark 25, respectively.

The stepper alignment mark 33 has a shape peculiar to each stepper producer in plan view, which is different from that of the testing-processing alignment mark 32. The detailed sizes of the stepper alignment mark 33 are not the essential feature of the present invention, and the description thereof will be omitted herein.

The testing-processing alignment mark 32 is disposed, rotated 180 degrees relative to the target mark 25. In addition, the target mark 25 and the testing-processing alignment mark 32 are formed such that the origin O (X0, Y0) of the elbow of the L-shaped pattern of the mark 25 coincides with that of the mark 32, i.e., the elbows of the marks 25 and 32 overlap (see, FIG. 2A). Both of the X and Y coordinates of one mark do not necessarily agree precisely with those of the other mark but the marks may be several μm apart from each other. In that case, if the target mark 25 and the testing-processing alignment mark 32 are formed in an identical opening, the marks 25 and 32 can share a region to be scanned with a laser in reading a position.

The organic buffer coating film 15, which is formed to protect the surface of the semiconductor integrated circuit chip, is generally made of a polyimide film or a polybenzoxazole film and has a resultant thickness of about several μm. Accordingly, if the organic buffer coating film 15 is present as it is over the target mark 25 and the testing-processing alignment mark 32, a smaller amount of laser beam for reading a position is reflected from the marks 25 and 32 and, in addition, the contrast becomes lower as the thickness of the organic buffer coating film 15 increases. Thus, formation of the opening 15a in the organic buffer coating film 15 increases the contrast of the target mark 25 and the testing-processing alignment mark 32 to the foundation.

In the structure shown in FIG. 2B, the inorganic passivation film 14 remains in the opening 15a in the organic buffer coating film 15. However, the entire part of the inorganic passivation film 14 located in the opening 15a in the organic buffer coating film 15 may be thinned or may be removed.

Then, an alignment method using alignment marks according to the first embodiment will be described.

The target mark 25 is an alignment mark for use in a laser machining process for cutting a fuse wire in a circuit for redundancy replacement. The testing-processing alignment mark 32 is an alignment mark for use in a probe test process, a wire bonding process, or a dicing process, in the semiconductor integrated circuit chip.

In the laser machining process, the target mark 25 is initially scanned in the X direction across the first Y-direction mark 25a (between X and X') with a laser beam for fuse processing. The reflected laser beam is monitored, thereby determining an X coordinate of the center of the first Y-direction mark 25a included in the target mark 25. Then, the target mark 25 is scanned in the Y direction across the first X-direction mark 25b (between Y and Y') with the laser beam for fuse processing. The reflected laser beam is monitored, thereby determining a Y coordinate of the center of the first X-direction mark 25b included in the target mark 25. Alternatively, the Y coordinate of the first X-direction mark 25b may be initially determined. In performing this alignment, the intensity of the laser beam is reduced to one-tenth or less of the intensity of laser machining so as to avoid damage of the target mark. Thereafter, the fuse wire to be processed is irradiated with normally one pulse of a laser beam, to be cut off. Alternatively, the laser beam is scanned in the X and Y directions with the fuse wire 23 to be processed irradiated with the laser beam as required, thereby blowing the fuse wire 23. Positional shifts caused from this process cannot be restored.

The target mark 25 is preferably placed at a corner of a chip, and it is more preferable that at least two target marks are diagonally disposed on the chip. Then, rotation or shrinkage of the chip can be corrected.

In the probe test or dicing process, the testing-processing alignment mark 32 is used such that the X and Y coordinates thereof are both determined by an ordinary image recognizing method.

In an exposing process, the stepper alignment marks 24 and 33 are irradiated with a laser beam from a light source different from that for exposing a resist film, thereby obtaining a reflected diffraction light beam. Then, position measurement is performed using the reflected diffraction light. In this process, a result of measuring errors in overlaying a resist film, provided with a reticle pattern, on an underlying circuit pattern is fed back to exposing apparatus, thereby reducing errors in the overlaying. To eliminate the overlaying shifts, this overlaying can be done again by reproducing a resist film that allows another pattern to be formed.

The structure of the semiconductor integrated circuit device according to this embodiment is characterized in that the target mark 25 is included in the metal layer including the fuse wire 23 made of a copper film in the circuit for redundancy replacement for repairing a defective memory bit. In other words, the target mark 25 and the fuse wire 23 are buried in trenches formed using the same mask. Thus, during the laser machining on the fuse wire 23, alignment for blowing the fuse wire 23 is performed using the target mark 25, thus reducing alignment errors that has conventionally occurred in blowing the fuse wire 23. As a result, drawbacks in the laser machining on the fuse wire 23 can be reduced. That is to say, unlike conventional methods, there occurs no alignment error caused by difference in formation process between the fuse wire and the target mark.

In addition, during the laser machining on the fuse wire 23, the substantially L-shaped target mark 25 of a copper film is scanned with a machining laser so that the reflected laser beam is measured, thereby obtaining information on the position of the mark. In this manner, highly accurate alignment is performed on the chip and misalignment is corrected. As a result, defects caused by errors in blowing the fuse wire can be suppressed.

Moreover, the probe test, wire bonding or dicing process uses the testing-processing alignment mark 32 that is made of the aluminum alloy film constituting the external-component-connecting pad electrode 31 and is formed in the same layer as the pad electrode 31. Thus, alignment for the probe test, wire bonding or dicing can be performed on the external-component-connecting pad electrode 31 or a scribing line (not shown) with high accuracy using a well-known mechanism.

It is necessary to include the target mark 25 and the fuse wire 23 in an identical metal layer. However, the target mark 25 and the fuse wire 23 are not necessarily included in the uppermost metal layer 12a and may be included in any one of the metal layers in the multilevel interconnect layer 12. The presence of the fuse wire 23 in the uppermost metal layer 12a reduces the thickness of interlevel dielectric film through which the laser beam passes during the laser machining, thereby reducing errors in the laser machining.

In a case where the fuse wire is formed in a metal layer located just under the uppermost metal layer 12a, the interlevel dielectric film on the fuse wire is thick, resulting in requiring a large laser energy for blowing the fuse and, in addition, causing damage on the interlevel dielectric film located under the fuse. Accordingly, it is preferable to provide an etching step for thinning the interlevel dielectric film over the fuse wire.

The target mark 25 and the testing-processing alignment mark 32 may be provided in at least one corner of a semiconductor integrated circuit chip. However, to further improve alignment accuracy, these marks are preferably provided in each corner of the semiconductor integrated circuit chip.

Each of the stepper alignment marks 24 and 33 needs to be provided in at least one location on a reticle.

In this embodiment, the case where the width W1 of the target mark 25 is the same as the width W2 of the testing-processing alignment mark 32 has been described as an example. However, the width W2 of the testing-processing alignment mark 32 may be two or more times larger than the width W1 of the target mark 25 so as to ease confirmation under an optical microscope during the probe test, wire bonding or dicing.

Whether or not there is an electrical connection between the target mark 25, the stepper alignment mark 24, the testing-processing alignment mark 32 and the stepper alignment mark 33 does not affect alignment accuracy. In this embodiment, an example in which no electrical connection is made between the four marks has been shown. However, electrical connection may be made between the marks.

Figure 3:
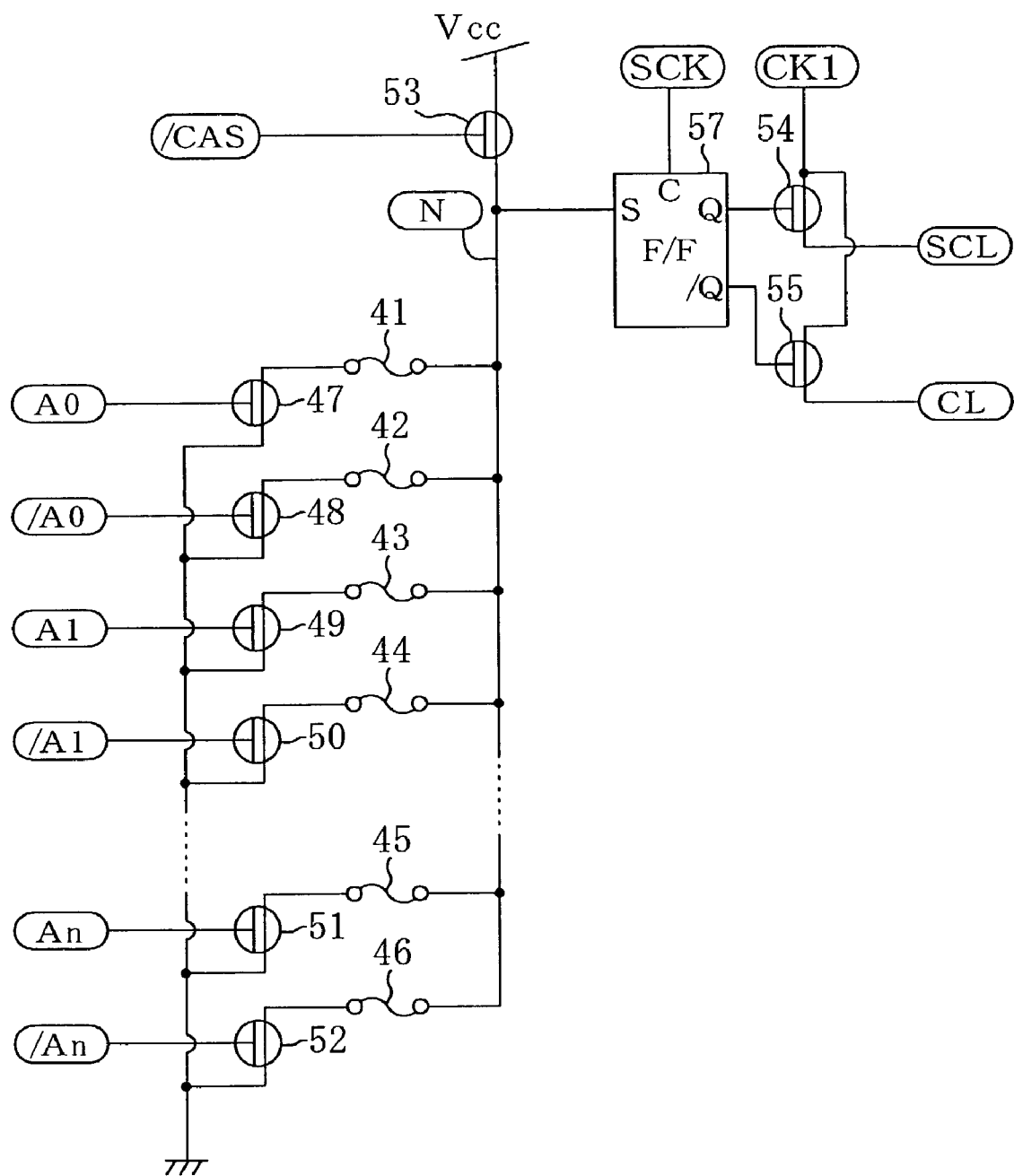
FIG. 3 is an electric circuit diagram illustrating an example of a circuit for redundancy replacement in the first embodiment.

FIG. 3 is an electric circuit diagram illustrating an example of a circuit for redundancy replacement. In such a DRAM, column and row addresses are determined using address multiplexing, thereby selecting an inner memory.

First, an inverted row address strobe signal /RAS goes to the L level, and then an inverted column address strobe signal /CAS is received, thereby generating output signals A0 to An and /A0 to /An corresponding to addresses with an address buffer circuit.

For switching to a spare memory bit, the fuse connected to the drain of a transistor to whose gate a signal, from among the output signals A0 to An and /A0 to /An, that is at the H level is applied is blown with a laser beam. Specifically, if the output signal A0 is at the H level, a fuse 41 is blown while a fuse 42 is not blown. On the other hand, if the output signal A0 is at the L level, the fuse 41 is not blown, and a fuse 42 is blown because the output signal /A0 is at the H level. Likewise with other fuses, if the output signals A1 and An are at the H level, fuses 43 and 45 are blown. If the output signals /A1 and /An are at the L level, the fuses 44 and 46 are not blown. If the output signals A1 and An are at the L level, fuses 43 and 45 are not blown, but the fuses 44 and 46 are blown because the output signals /A1 and /An are at the H level.

If the inverted column address strobe signal /CAS is at the H level, a second transistor 53 is electrically continuous, and a node N is at the H level. Thus, in switching from a defective memory bit to a spare memory bit, even if first transistors 47 to 52 are in ON state, the fuses 41 to 46 are discontinuous depending on the addresses. Accordingly, the potential of the node N remains at the H level.

For an address not to be switched to a spare memory bit, one of the first transistors 47 to 52 to which unblown one of the fuses 41 to 46 is connected is in the ON state, so that the potential of the node N goes to the L level.

Accordingly, one of the output signals A0 to An and /A0 to /An from the address buffer circuit goes to the H level, and then a flip-flop circuit 57 receives the level of the node N in response to a set clock signal SCK and holds the received level with stability. Then, after a lapse of time after the inverted row address strobe signal /RAS has gone to the L level, a clock signal CK1 to third and fourth transistors 54 and 55 goes to the H level. The potential state of the node N held in the flip-flop circuit 57 allows a switching signal SCL or CL from the transistor 54 or 55 to go to the H level and to be output.

That is to say, for switching to a spare memory bit, the potential of the node N is at the H level, an output terminal Q of the flip-flop circuit 57 outputs a signal at the H level. Thus, the third transistor 54 is turned ON, and the switching signal SCL at the H level is output. In this manner, a spare memory bit is selected. In this case, another output terminal /Q outputs a signal at the L level. Thus, the fourth transistor 55 is turned OFF, and the switching signal CL remains at the L level. Accordingly, functioning memory bits are not selected.

For not selecting a spare memory bit, the node N is at the L level. Thus, the switching signal SCL remains at the L level and is not selected, while the switching signal CL is at the H level. In this manner, functioning memory bits are selected.

A configuration of a circuit for redundancy replacement to which the present invention is applied is not limited to a configuration shown in FIG. 3.

(Embodiment 2)

Hereinafter, alignment marks formed in a semiconductor integrated circuit device including a copper interconnect and an external-component-connecting pad electrode made of an aluminum alloy according to a second embodiment of the present invention will be described.

Figure 4A:
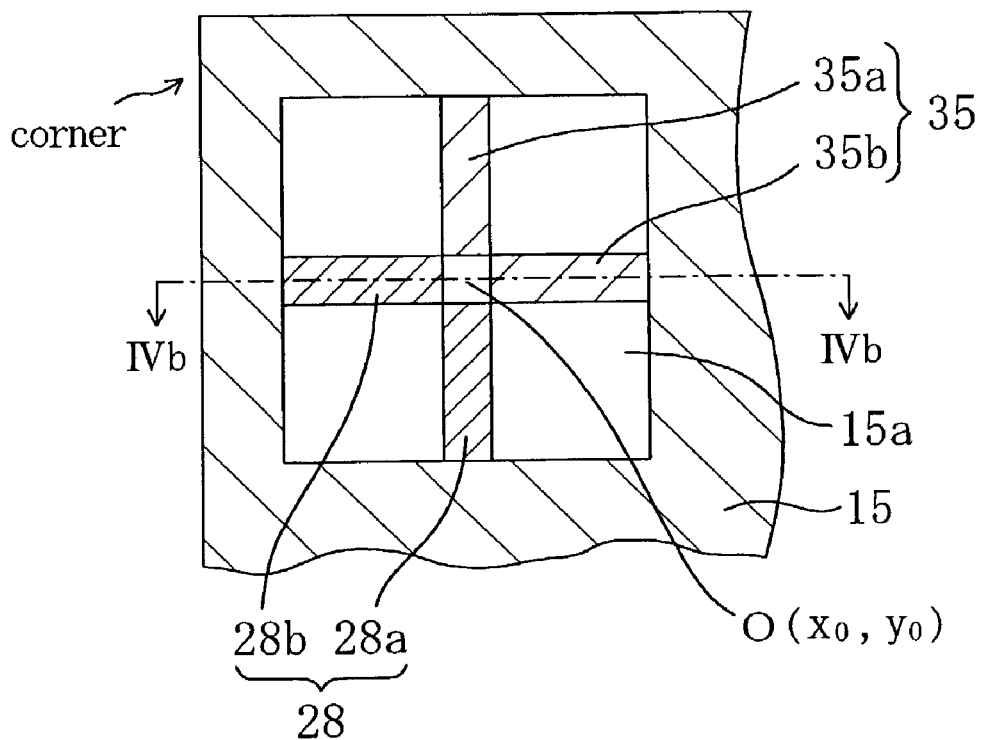
FIGS. 4A and 4B are respectively a plan view and a cross-sectional view taken along the line IVb—IVb, showing a structure near alignment marks in a semiconductor integrated circuit device according to a second embodiment of the present invention.
Figure 4B:
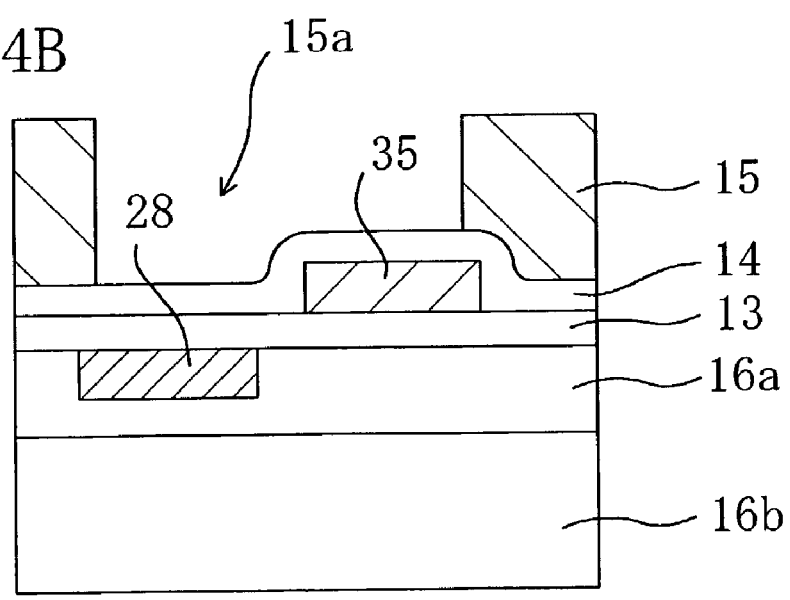

FIGS. 4A and 4B are respectively a plan view and a cross-sectional view taken along the line IVb—IVb, showing a structure near alignment marks in the semiconductor integrated circuit device of this embodiment. The semiconductor integrated circuit device of this embodiment has the same structure as that of the first embodiment as shown in FIG. 1, except for the structures of a target mark 28 and a testing-processing alignment mark 35.

As shown in FIGS. 4A and 4B, the target mark 28 is formed, concurrently with the formation of the ordinary wire 22, fuse wire 23 of a circuit for redundancy replacement for use in repairing a defective memory bit, and stepper alignment mark 24 in the uppermost layer of the multilevel interconnect layer (see FIG. 1), by filling trenches formed in the interlevel dielectric film 16a with a copper film. The target mark 28 is shaped in the form of substantially an L lacking its elbow in plan view. The testing-processing alignment mark 35 is formed, concurrently with the formation of the external-component-connecting pad electrode 31 and the stepper alignment mark 33 (see FIG. 1), by patterning an aluminum alloy film containing aluminum as a main component (e.g., an AlCu film containing several percent of copper). The testing-processing alignment mark 35 is shaped in the form of substantially an L lacking its elbow in plan view. The organic buffer coating film 15 has an opening 15a over the target mark 28 and the testing-processing alignment mark 35.

The second embodiment is different from the first embodiment in that neither a copper film nor an aluminum alloy film is formed in the elbows where the L-shaped target mark 28 and testing-processing alignment mark 35 overlap.

The target mark 28 is substantially L-shaped in plan view, having a first Y-direction mark 28a in the form of a strip extending in the Y direction and a first X-direction mark 28b in the form of a strip extending in the X direction. No copper film is formed in the elbow of the substantial L-shape.

The testing-processing alignment mark 35 is substantially L-shaped in plan view, having a second Y-direction mark 35a extending in the Y direction and a second X-direction mark 35b extending in the X direction.

In this structure of the second embodiment, the same effect as in the first embodiment can be obtained. In addition, such a configuration enables recognition of a chip with a more distinctive image using the testing-processing alignment mark 35, thus further easing the alignment.

In the structure shown in FIG. 4B, the inorganic passivation film 14 remains in the opening 15a in the organic buffer coating film 15. However, the entire part of the inorganic passivation film 14 located in the opening 15a in the organic buffer coating film 15 may be thinned or may be removed.

In this embodiment, it is also necessary to include the target mark 28 and the fuse wire 23 in an identical metal layer. However, the target mark 28 and the fuse wire 23 are not necessarily included in the uppermost metal layer 12a and may be included in any one of the metal layers in the multilevel interconnect layer 12. The presence of the fuse wire 23 in the uppermost metal layer 12a reduces the thickness of interlevel dielectric films through which the laser beam passes during the laser machining, thereby reducing errors in the laser machining.

The target mark 28, the stepper alignment mark 24, the testing-processing alignment mark 35 and the stepper alignment mark 33 may be provided in at least one corner of a semiconductor integrated circuit chip. However, to further improve alignment accuracy, these marks are preferably provided in each corner of the semiconductor integrated circuit chip.

An alignment method using the alignment marks according to the second embodiment is the same as in the first embodiment.

(Embodiment 3)

Hereinafter, alignment marks formed in a semiconductor integrated circuit device including a copper interconnect and an external-component-connecting pad electrode made of an aluminum alloy according to a third embodiment of the present invention will be described.

Figure 5:
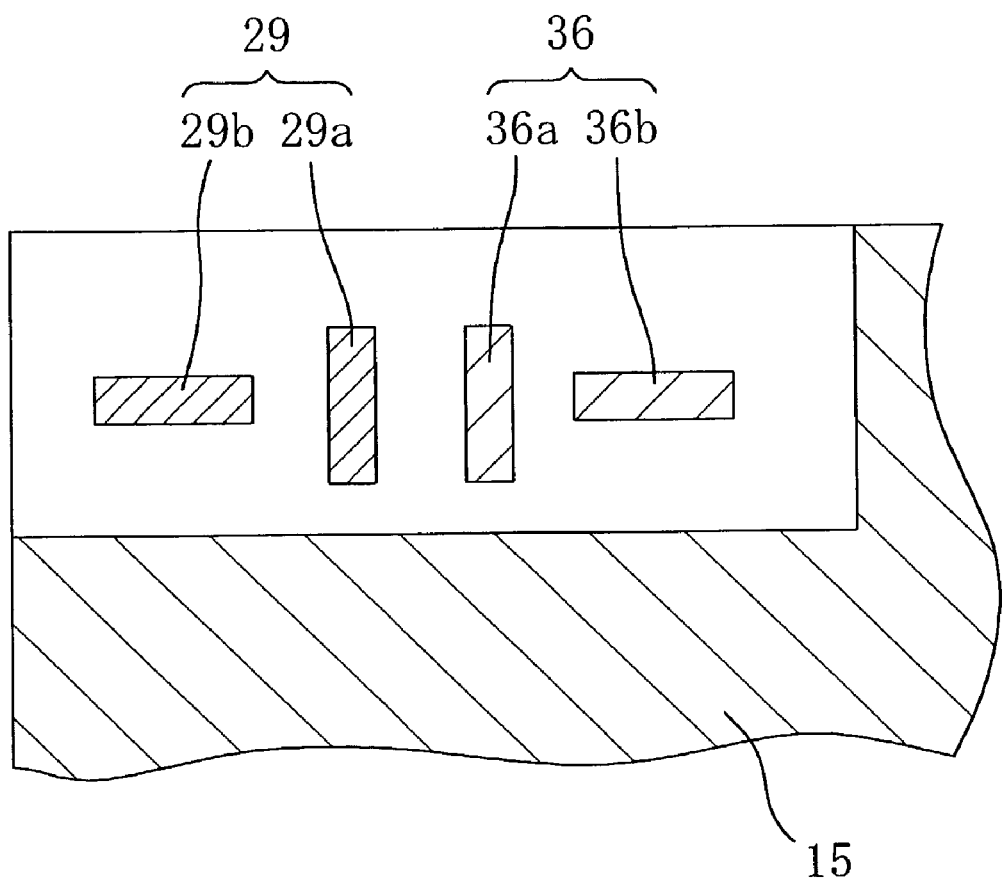
FIG. 5 is a plan view showing a structure near alignment marks in the semiconductor integrated circuit device according to a third embodiment of the present invention.

FIG. 5 is a plan view showing a structure near alignment marks in the semiconductor integrated circuit device of this embodiment. The semiconductor integrated circuit device of this embodiment also has the same structure as that of the first embodiment, as shown in FIG. 1, except for the structures of a target mark 29 and a testing-processing alignment mark 36.

As shown in FIG. 5, the target mark 29 is formed, concurrently with the formation of the ordinary wire 22, fuse wire 23 of a circuit for redundancy replacement for use in repairing a defective memory bit, and stepper alignment mark 24 in the uppermost layer of the multilevel interconnect layer (see FIG. 1), by filling trenches formed in the interlevel dielectric film 16a with a copper film. The testing-processing alignment mark 36 is formed, concurrently with the formation of the external-component-connecting pad electrode 31 and the stepper alignment mark 33 (see FIG. 1), by patterning an aluminum alloy film containing aluminum as a main component (e.g., an AlCu film containing several percent of copper). The organic buffer coating film 15 has an opening 15a over the target mark 29 and the testing-processing alignment mark 36.

In the third embodiment, the target mark 29 and the testing-processing alignment mark 36 are substantially T-shaped, which are different from those of the second embodiment having substantial L-shapes. The structure of the third embodiment is the same as that of the second embodiment, except for the difference in shape of the alignment marks.

The target mark 29 is substantially T-shaped in plan view, having a first Y-direction mark 29a in the form of a strip extending in the Y direction and a first X-direction mark 29b in the form of a strip extending in the X direction spaced apart from the first Y-direction mark 29a.

The testing-processing alignment mark 36 is substantially T-shaped in plan view, having a second Y-direction mark 36a extending in the Y direction and a second X-direction mark 36b extending in the X direction spaced apart from the second Y-direction mark 36a.

The structure of the third embodiment provides the same effect as that of the second embodiment. In addition, such substantial T-shapes allows the target mark and the testing-processing alignment mark to be disposed in the direction of the length, thereby narrowing the width of a region where the marks for alignment are arranged. Accordingly, the marks can be arranged on a scribing line in a corner of the chip. As a result, no special region for alignment mark arrangement is required.

In the third embodiment, the target mark and the testing-processing alignment mark are disposed so as not to overlap in plan view. Thus, recognizing errors, such as confusing a reflected light beam from the testing-processing alignment mark with that from the target mark, can be effectively prevented during alignment.

The target mark and the testing-processing alignment mark may overlap in plan view and may even overlap completely, so long as the marks can be distinguished, e.g., in a case where the width of the upper testing-processing alignment mark is half of that of the target mark. Only the alignment mark 36 may be substantially L-shaped in plan view as described above at a corner of a chip, while the target mark 29 may be substantially T-shaped in plan view.

(Other Embodiment)

In the foregoing embodiments, examples of application of the present invention to a target mark as an alignment mark for use in processing a fuse wire provided to a circuit for redundancy replacement in a system-on-a-chip including a DRAM or SRAM has been described. However, the present invention is not limited to these embodiments. An alignment mark to which the present invention is applied may be any type usable for alignment between a member to be laser-processed (trimmed) and a site to be irradiated with a laser beam.

Figure 6:
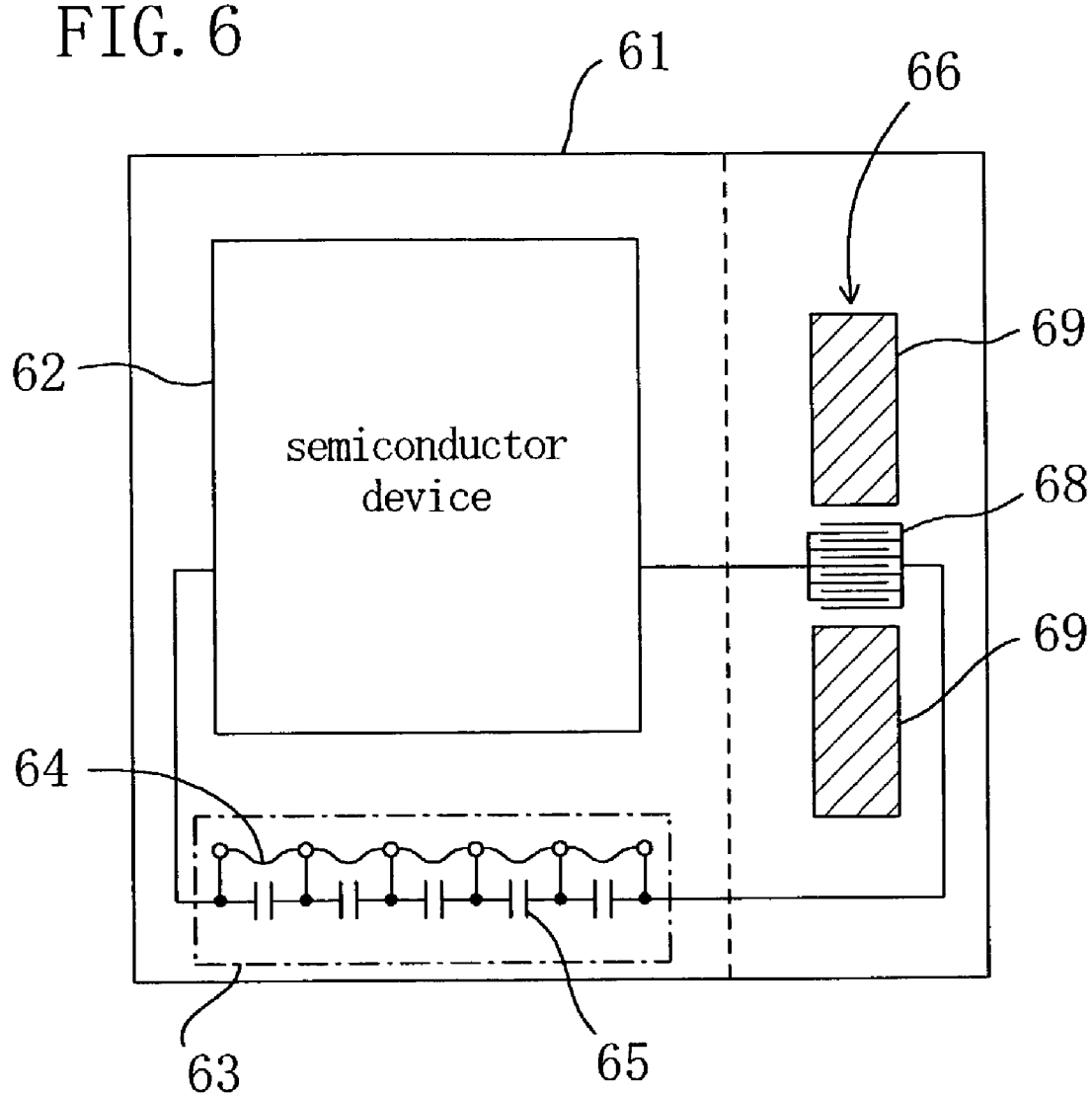
FIG. 6 is a circuit configuration schematically illustrating a structure of a combined semiconductor circuit with variable capacitance according to other embodiments of the present invention.

FIG. 6 is a circuit configuration schematically illustrating a structure of a combined semiconductor circuit with variable capacitance according to other embodiments of the present invention. As shown in FIG. 6, the combined semiconductor circuit includes: semiconductor device 62 formed in a silicon thin film 61 on a sapphire substrate (not shown); capacitor 63 equipped with a polysilicon fuse electrically connected to the semiconductor device 62; and surface-acoustic-wave oscillator 66 formed in a ZnO thin film on the sapphire substrate. The oscillator 66 is made up of a surface-wave oscillating electrode 68 with a single-level aluminum interconnect and a reflector 69. The capacitor 63 is made up of polysilicon fuses 64 and capacitors 65 with a two-level polysilicon structure The combined semiconductor circuit functions as a single-chip oscillator and can adjust the oscillated frequency at about ±5 ppm level by changing the resonant frequency of the oscillator 66. On the other hand, switching connections among the capacitors 65 connected in series by trimming the polysilicon fuses 64 enables fine frequency adjustment at about ±1 ppm level. In this example, the capacitor 63 equipped with the polysilicon fuses is set to values from equal to, to 16 times as large as, the unit capacitance. Accordingly, by trimming the polysilicon fuses, the capacitance is variable up to 31-fold in the unit capacitance steps.

These polysilicon fuses 64 may be arranged in a metal layer in the multilevel interconnect layer, as the fuse wire 23 described in the first embodiment (see FIG. 1). In addition, an alignment mark (a target mark) and the polysilicon fuses 64 may be formed in an identical metal layer by patterning an identical polysilicon film. As a result, highly accurate alignment of the polysilicon fuses relative to a site to be irradiated with a machining laser beam can be performed using the target mark made of polysilicon.

Figure 7:
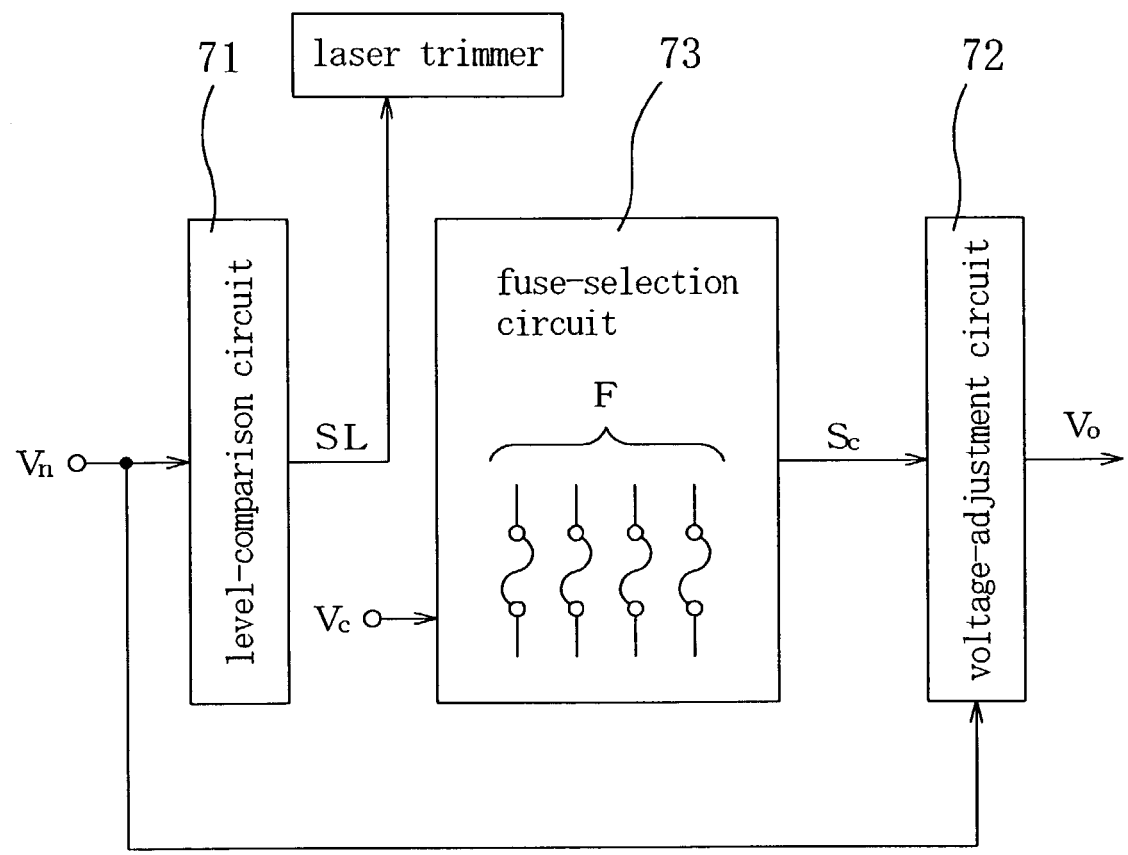
FIG. 7 is a block diagram illustrating a configuration of a voltage-correction circuit for correcting an output voltage from a voltage-generation circuit according to the other embodiments.
Figure 8:
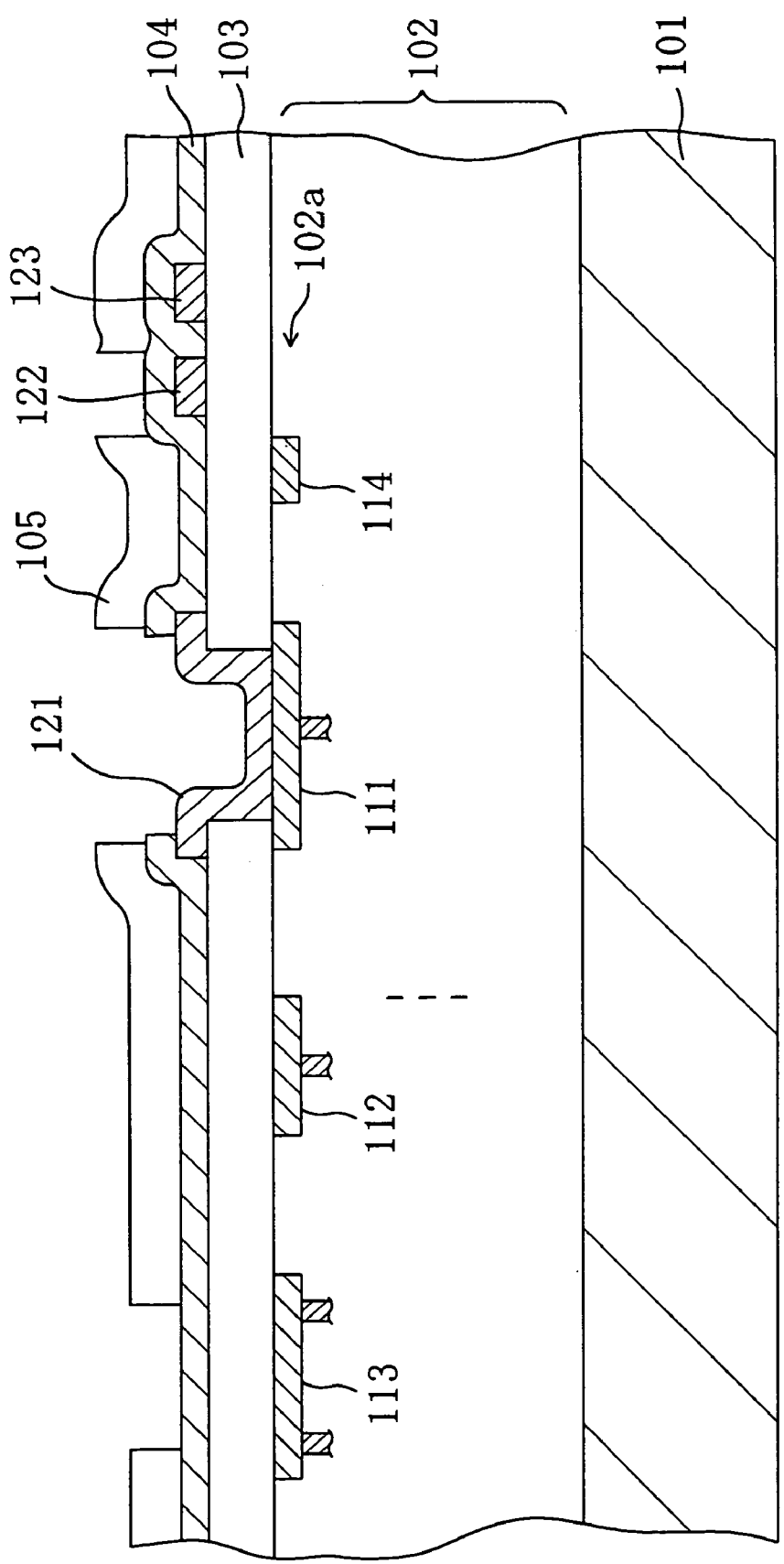
FIG. 8 is a cross-sectional view showing a structure of an interconnect layer in a known system-on-a-chip including a DRAM or SRAM (a semiconductor integrated circuit device) with a function of redundancy replacement.

FIG. 7 is a block diagram illustrating a configuration of a voltage-correction circuit for correcting an output voltage from a voltage-generation circuit according to other embodiments of the present invention. As shown in FIG. 7, the voltage-correction circuit includes: level-comparison circuit 71 for comparing an input voltage with a reference voltage; voltage-adjustment circuit 72 for generating a corrected voltage; and fuse-selection circuit 73 intervening between the level-comparison circuit 71 and the voltage-adjustment circuit 72. The level-comparison circuit 71 outputs a fuse-selecting signal SL based on comparison of the input voltage Vn with the reference voltage. A laser trimmer blows a fuse from among a plurality of fuses F, in response to the fuse-selecting signal SL. The fuse-selection circuit 73 outputs a correcting signal Sc indicating which one of the fuses F is blown in response to a signal Vc at a constant voltage. The voltage-adjustment circuit 72 selects a corrected value of the input voltage Vn based on the correcting signal Sc indicating which one of the fuses F is blown and then generates an output voltage Vo obtained by correcting the input voltage Vn based on the corrected value.

The fuses F may be arranged in one of the metal layers in the multilevel interconnect layer, as the fuse wire 23 described in the first embodiment (see FIG. 1). In addition, an alignment mark (a target mark) and the fuses F may be formed in an identical metal layer by patterning an identical conductor film (e.g., a copper film, a polysilicon film, or an aluminum alloy film).

The inventive semiconductor integrated circuit device is applicable to a programmable gate array (PLGA) in which a gate array can be programmed by a user using fuse processing.

What is claimed is:

1. A semiconductor integrated circuit device comprising:
a substrate;
an interlevel dielectric film formed over the substrate;
an external-component-connecting wire made of a first metal film and formed in a first groove provided in the interlevel dielectric film;
a fuse wire made of the first metal film and formed on a second groove provided in the interlevel dielectric film;
a target mark made of the first metal film and formed in a third groove provided in the interlevel dielectric film;
a dielectric film formed over the interlevel dielectric film to cover the target mark;
a pad electrode made of a second metal film, formed directly on the dielectric film and connected to the external-component-connecting wire, and
a pad-electrode alignment mark for use in alignment relative to the pad electrode, the pad-electrode alignment mark being formed on the dielectric film and made of the second metal film,
wherein the target mark and the pad-electrode alignment mark are substantially L-shaped in plan view, and the substantially L-shaped target mark and pad-electrode alignment mark overlap at their elbows in plan view, and
the target mark is formed in a same layer as the fuse wire provided below the pad electrode, and is used as an alignment mark during laser machining for blowing the fuse wire.

2. The device of claim 1, including a stepper alignment mark formed on the dielectric film and made of the second metal film.

3. The device of claim 1, further includes a stepper alignment mark made of the first metal film and formed in a fourth groove provided in the interlevel dielectric film.

4. The device of claim 1, wherein
the target mark and the pad-electrode alignment mark overlap at their elbows in plan view; and
the target mark and the pad-electrode alignment mark are disposed in point-symmetry with each other centered on the elbows.

5. The device of claim 1, wherein
the target mark includes a first Y-direction mark in the form of a stripe extending in a Y direction and a first X-direction mark in the form of a stripe extending in an X direction;
the pad-electrode alignment mark includes a second Y-direction mark in the form of a stripe extending in the Y direction and a second X-direction mark in the form of a stripe extending in the X direction; and
the elbows of the target mark and the pad-electrode alignment mark include neither the first metal film nor the second metal film.

6. The device of claim 1, wherein the external-component-connecting wire, the fuse wire and the target mark are included in the uppermost metal layer of a multilevel interconnect layer excluding an interconnect layer in which the pad electrode is formed.

7. The device of claim 1, including a buffer coating film, formed over the dielectric film and having an opening over the target mark, the fuse wire and the pad electrode.

8. The device of claim 1, including an inorganic passivation film covering respective parts of the dielectric film and the pad electrode.

9. The device of claim 1, wherein the first metal film is made of a copper film; and
wherein the second metal film is made of an aluminum alloy film containing aluminum as a main component.

* * * * *